(12) United States Patent
Belenger et al.

(10) Patent No.: US 6,784,667 B2
(45) Date of Patent: Aug. 31, 2004

(54) ESTIMATED REMAINING LAMP LIFE INDICATOR SYSTEM

(75) Inventors: Robert V. Belenger, Raynham, MA (US); Gennaro R. Lopriore, Somerset, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 116 days.

(21) Appl. No.: 10/124,705

(22) Filed: Apr. 3, 2002

(65) Prior Publication Data

US 2003/0189429 A1 Oct. 9, 2003

(51) Int. Cl.$^7$ .................. G01R 31/00; G01N 27/42
(52) U.S. Cl. ...................... 324/414; 324/525
(58) Field of Search .................. 324/414, 525, 324/522, 555; 340/642, 458; 315/46

(56) References Cited

U.S. PATENT DOCUMENTS 5,274,611 A * 12/1993 Donohoe ............... 368/10
6,556,017 B1 * 4/2003 Pettersson ............. 324/414

* cited by examiner

*Primary Examiner*—Albert Decady
*Assistant Examiner*—James Kerveros
(74) *Attorney, Agent, or Firm*—James M. Kasischke; Michael F. Oglo; Jean-Paul A. Nasser

(57) ABSTRACT

A system and method for estimating the remaining life of a light bulb, which includes a device for determining cold filament resistance of the light bulb while the light bulb is in a non-operating mode, a comparison device for comparing the cold filament resistance of the light bulb to a reference near an end of its life filament resistance, and a device for displaying an indication of a life expectancy for the light bulb. The system may be integrated into a vehicle or may be portable.

19 Claims, 2 Drawing Sheets

ESTIMATED REMAINING LAMP LIFE INDICATOR SYSTEM

STATEMENT OF GOVERNMENT INTEREST

The invention described herein may be manufactured and used by or for the Government of the United States of America for Governmental purposes without the payment of any royalties thereon or therefor.

CROSS REFERENCE TO OTHER PATENT APPLICATIONS

Not applicable.

BACKGROUND OF THE INVENTION (1) Field of the Invention

The present invention relates to lamp life estimating systems and more particularly to a system for alerting the user of a device or fixture employing an incandescent lamp to the expected time to failure of that incandescent lamp (light bulb). The system may be integrated into a vehicle or may be a stand alone system.

(2) Description of the Prior Art

A common failure mode for incandescent light bulbs is the parting of its filament caused by thermal shock during turn-on. The possibility of this occurring increases as the bulb is used and its filament "boils off", leaving it thinner and physically weaker. Advertised operating life estimates for a bulb tell a user what to expect on average for a useful life. However, mitigating factors such as the frequency of turn-on can alter the useful life expectancy of the bulb and unexpected failures during turn-on and during continuous operation often occur. The basic failure mode remains the same in all cases; the weakening of the filament by the boiling off of the filament material and ultimate parting of the filament. Empirical data derived from a manufacturer's testing for the life expectancy of their various types of incandescent bulbs can be used as a practical reference point to estimate the expected life remaining for a bulb.

For ordinary home use, expected life remaining may not be critical, but for some situations such as automobile head lamp burn out or burnout of safety lighting in critical areas of a plant or parking lot this can be a safety concern. Knowing how much longer a bulb might last provides a considerable safety factor as well as a financial factor to an auto owner by avoiding being stopped for a moving violation because of a burned out lamp. The safety and financial considerations connected to dependable lighting systems for commercial and municipal properties is also considerable.

Systems for predicting the failure of a lamp are known in the art. For example, U.S. Pat. No. 5,578,998 to Kasprowicz illustrates a lamp failure predicting apparatus which includes a power supply and a resistor in series with an electric lamp. The apparatus further includes a data acquisition system for comparing a voltage drop across the resistor at a predetermined time with a predetermined minimum value. The method employed by Kasprowicz includes the steps of establishing a predetermined minimum value of voltage drop across the resistor for acceptable lamps, placing a test lamp in series with the battery and resistor, and supplying voltage to the test lamp for a test interval of time. The method further includes the steps of determining a voltage drop across the resistor at a predetermined time, comparing the voltage drop with the predetermined minimum value, and rejecting the lamp when the voltage drop is below the predetermined minimum value.

U.S. Pat. No. 5,952,832 to Stevanovic et al. relates to a diagnostic circuit for predicting fluorescent lamp failure by monitoring filament currents. When a filament failure is detected, information is processed and a request is sent to replace the lamp before it actually fails. The diagnostic circuit is low power and low voltage and is electrically isolated from the high voltage end of the lamp.

The detection systems of Kasprowicz and Stevanovic et al. provide testing on operating lamps in order to measure voltage changes. Additionally, they both use complicated and expensive circuitry to accomplish their tasks.

U.S. Pat. No. 4,831,564 illustrates an apparatus for estimating and displaying the remainder of lifetime of a xenon lamp. The apparatus has a memory in which is stored data on the values of the discharge power of an average xenon lamp for maintaining the irradiance of the light emitted from the xenon lamp on the surface of a sample at a predetermined level, and the corresponding time of use of the average xenon lamp; a discharge power measuring device for measuring the level of the discharge power of a xenon lamp being used to irradiate the surface of a sample while the xenon lamp is being controlled to maintain the irradiance of the light emitted from the xenon lamp on the surface of the sample at a predetermined level, a timer for providing at each of a plurality of predetermined times instructions for starting a comparison of the value of the discharge power of the xenon lamp being used with the stored values, an arithmetic unit for obtaining from the memory the value of the stored cumulative time of use corresponding to the measured value of the discharge power of the xenon lamp being used and the value of the limit time of use of the average xenon lamp, and computing the difference as the estimated remainder of the lifetime of the xenon lamp being used; and a display for indicating the estimated remainder of the lifetime of the xenon lamp.

U.S. Pat. No. 5,057,814 to Onan et al relates to an electrical malfunction detection system which has a power supply connected to lamps by a low value resistor. The resistor is part of a voltage divider system which provides input signals to a number of comparators. The comparators provide appropriate signals to a microprocessor to indicate normal operation. When a malfunction is detected, the voltage drop across the low value resistor changes and alters the output of the comparators. The microprocessor thereafter produces an appropriate warning signal. The system is incorporated into a vehicle turn signal circuit to detect a burned out bulb.

U.S. Pat. No. 5,274,611 to Donohoe illustrates an apparatus for estimating the expired portion of the expected total service life of a mercury vapor lamp based upon the time the lamp is electrically energized. The length of time the lamp is energized is measured for each time period that the lamp is energized throughout the life of the lamp. A lamp usage value is determined for each time period that the lamp is energized. The lamp usage value for each time period is determined by assigning a first time dependent value for each time unit of a first predetermined time segment of the time period that the lamp is energized. A second time dependent value is assigned for each time unit of a second predetermined time segment of the time period commencing after the expiration of the first time segment that the lamp is energized. A third time dependent value is assigned for each time unit of the time period that the lamp is energized beyond the expiration of the second time segment. The first, second and third time dependent values are combined to form the lamp usage value for each time period. The lamp usage values are accumulated for each time period the lamp is energized to provide a total of the lamp life usage value. The total lamp life usage value is displayed as an indication of the expired life of the lamp.

U.S. Pat. No. 5,801,623 to Chen et al. illustrates a method of detecting a lamp outage condition in a vehicle flasher system. The method includes the steps of a) initializing an adaptive flasher current variable when the vehicle flasher system is powered; b) monitoring the vehicle flasher system to detect a driver flasher signal request; c) measuring current output from the plurality of lamps in the vehicle flasher system; d) determining whether the level of measured current is indicative of a lamp outage condition by comparing the measured current to the adaptive flasher current variable; e) setting the adaptive flasher current variable equal to the measured current if the measured current falls within a predetermined learning range, thereby compensating for resistance changes in the flasher system over time to allow lamp outage detection; and f) returning to step b).

The Suga, Onan et al., Donohoe, and Chen et al. systems are complex. Further, they either deal with lamps which are in an outage condition already or equipment situations which depend on using running time totals and comparators to predict life expectancy of the items under test.

SUMMARY OF THE INVENTION

Accordingly, it is an object of the present invention to provide a system for indicating the estimated remaining life of a light bulb.

It is a further object of the present invention to provide a system as above which is simpler and less complicated.

The foregoing objects are attained by the estimated remaining lamp life indicator system of the present invention.

In accordance with the present invention, a system for estimating the remaining life of a light bulb or lamp broadly comprises means for determining a physical condition of the light bulb or lamp while the light bulb or lamp is in a non-operating mode, means for comparing the physical condition of the light bulb or lamp to a reference physical condition of a light bulb or lamp near the end of its life, and means for displaying an indication of a life expectancy for the light bulb or lamp.

A method for estimating the remaining life of a light bulb or lamp broadly comprises the steps of measuring the cold filament resistance of the light bulb and comparing the measured cold filament resistance to a reference near end of life filament resistance.

Other details of the estimated remaining lamp life indicator system of the present invention, as well as other objects and advantages attendant thereto, are set forth in the following detailed description and the accompanying drawings wherein like reference numerals depict like elements.

DESCRIPTION OF THE PREFERRED EMBODIMENT(S)

The estimated remaining lamp life indicator system of the present invention permits an operator to view a readout of the approximate remaining life of an incandescent bulb. The system of the present invention can be integrated into an automobile's, an airplane's, a boat's, or any vehicle's lighting system. The system could also be a stand alone device suitable for portable use around a home, manufacturing facility, or any facility where incandescent bulbs are used in quantity and where safety and security are important factors to be considered.

Figure 1:
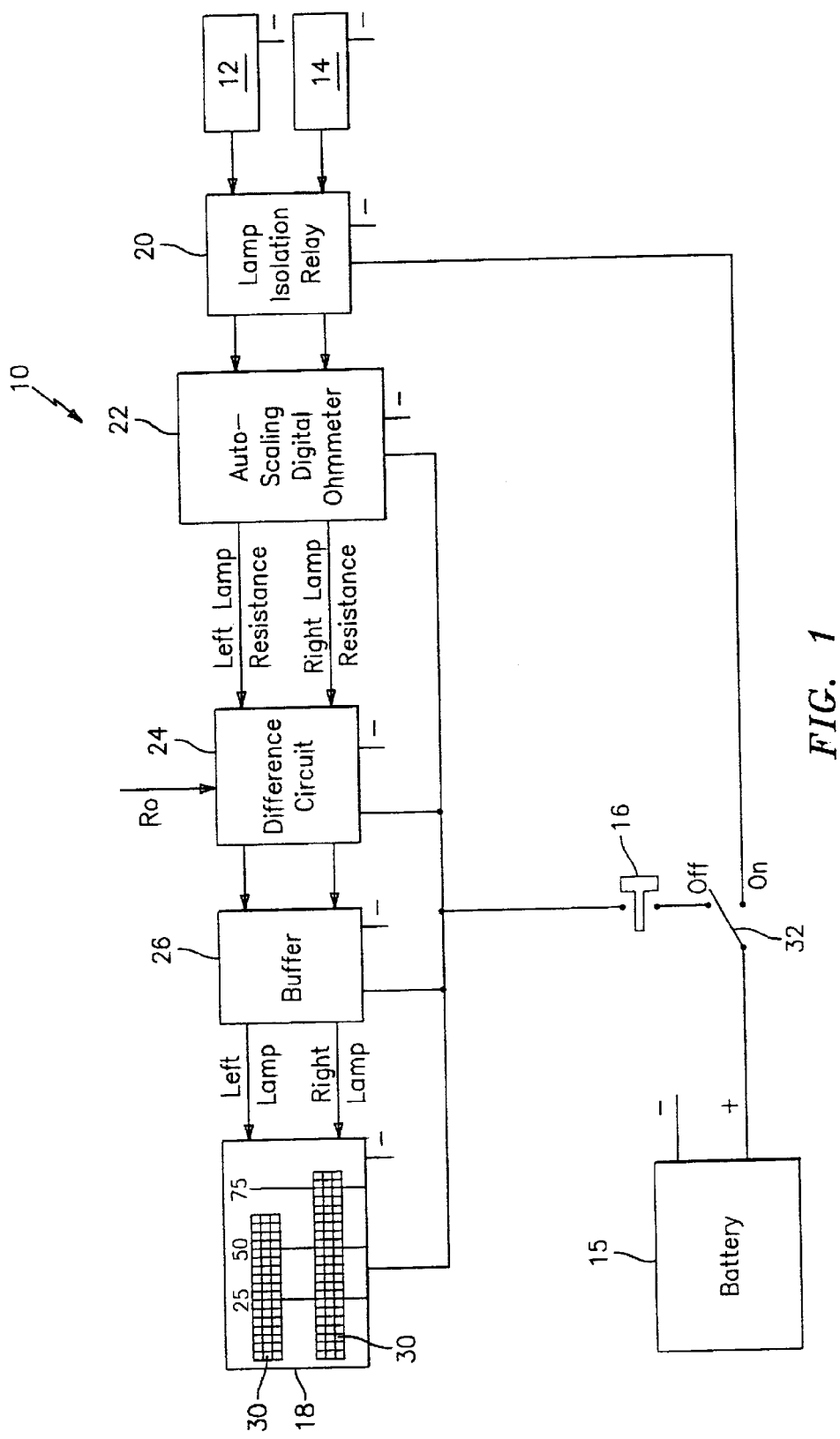
FIG. 1 is a schematic representation of an embodiment of an estimated remaining lamp life indicator system in accordance with the present invention incorporated into a vehicle.

FIG. 1 illustrates an integrated system 10 for estimating the remaining lamp life of bulbs 12 and 14 on board a vehicle. The vehicle could be an automobile and the bulbs 12 and 14 could be the headlights on the automobile. The general approach employed by the system 10 is to measure the cold filament resistance of the lamps 12 and 14 and compare the measured resistances to a manufacturer's reference life test data for cold filament resistance $R_o$ at or near the end of life for the particular variety of bulb being used and to display the estimated lamp life remaining for each bulb 12 and 14 based on the difference between the measured resistance(s) and the manufacturer's resistance for a reference light bulb near an end of its life. The gradual "boiling away" of the filament of the bulb 12 or 14 reduces the available metal to conduct current and thereby increases its resistance as the bulb is used. The more hours of use, the higher the resistance will be and the weaker the filament.

The system 10 includes a press-to-test switch 16 which applies car battery power to the system 10 with the vehicle's light bulbs 12 and 14 off. The press-to-test switch 16 may be a spring loaded push button switch that closes when depressed and opens when released. The switch 16 allows the system 10 to measure the cold resistance of the lamps or bulbs 12 and 14. The switch 16 is held until a reading is visible on the indicator 18. The indicator 18 may be any suitable indicating device capable of taking a digital output and transforming it into a bar display whose length is the analog of expected life remaining for the kind of bulb under test.

The system 10 includes a lamp isolation relay 20 which in a normal, non-energized position disconnects the light bulbs 12 and 14 from the positive side of the battery 15 and isolates the light bulbs 12 and 14 from other automobile components which may cause an auto-scaling digital ohmmeter 22 to take an erroneous reading of the light bulbs' cold resistance. The relay 20 may be a multiple contact electromechanical or other suitable relay with sufficient poles and throws to permit the light bulbs 12 and 14 to be isolated from other circuits in the light wiring that might cause the ohmmeter 22 to give an erroneous reading of cold filament resistance. The ohmmeter 22 may comprise any suitable state-of-the-art digital ohmmeter of sufficient accuracy and resolution to measure the resistance of a bulb's cold filament resistance. The state-of-the-art auto-scaling feature permits it to adapt its resistance measurement range to the lowest possible one in order to get maximum sensitivity and resolution, especially when resistance values are less than 10 ohms. For multiple bulb monitoring, multiple channels would be necessary or a multiplexing system used with a single ohmmeter.

As previously mentioned, the ohmmeter 22 measures the cold resistance of the light bulbs 12 and 14 and passes the measured cold resistances onto a difference circuit 24 where the manufacturer's reference data for cold resistance $R_o$ of the light bulbs near their end of advertised expected life is compared to the measured resistance(s). The difference circuit 24 is a circuit whose output is the difference between two inputs. In this case, the difference in resistance between $R_o$ (an empirically determined resistance value representing the cold filament resistance of a specific type of bulb whose filament's ability to withstand thermal stress is nearing its limit) and the measured value(s) of cold filament resistance (s) of the bulb(s) under test. The difference(s) is/are represented by a digital word of sufficient length to accommodate the required accuracy of measurement.

The difference(s) determined by the circuit 24 is/are passed onto the buffer 26 in a digital format. The buffer 26 is an isolation and storage device with sufficient power to drive the circuits in the indicator 18 and isolate the difference circuit 24 from it. The computed difference(s) are temporarily stored in the buffer 26 and then passed on to the indicator 18 where the digital data is processed to represent a length of remaining life for the light bulb(s) based on the measured cold filament resistances. The converted data may be expressed as an analog in the length of the display bar(s) 30 representing percent of lamp life remaining.

The system 10 further includes a light switch 32 which is wired to insure that the system 10 can not operate while the light bulbs 12 and 14 are on. The light switch 32 may be an automobile light switch with sufficient poles and throws to prevent the resistance measurement being taken when the lamps or bulbs 12 and 14 are on.

While the integrated system of FIG. 1 has been described in the context of being onboard an automobile, it should be recognized that the system 10 could be incorporated into other vehicles such as trucks, boats, planes, buses, trains, etc.

Figure 2:
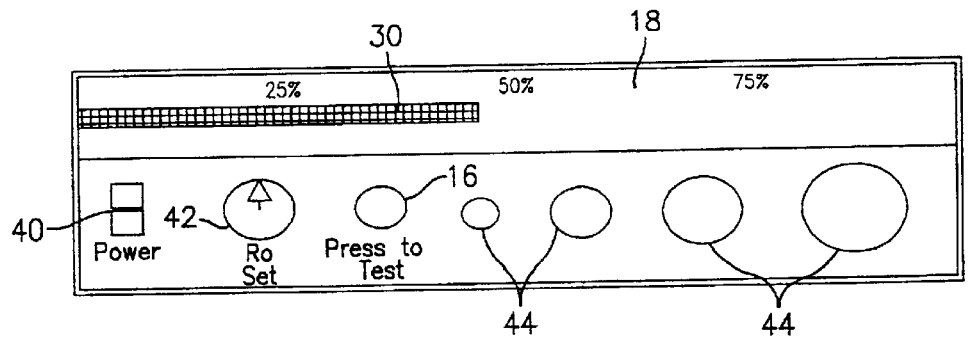
FIG. 2 is a schematic representation of an embodiment of a portable estimated remaining lamp life indicator system.
Figure 3:
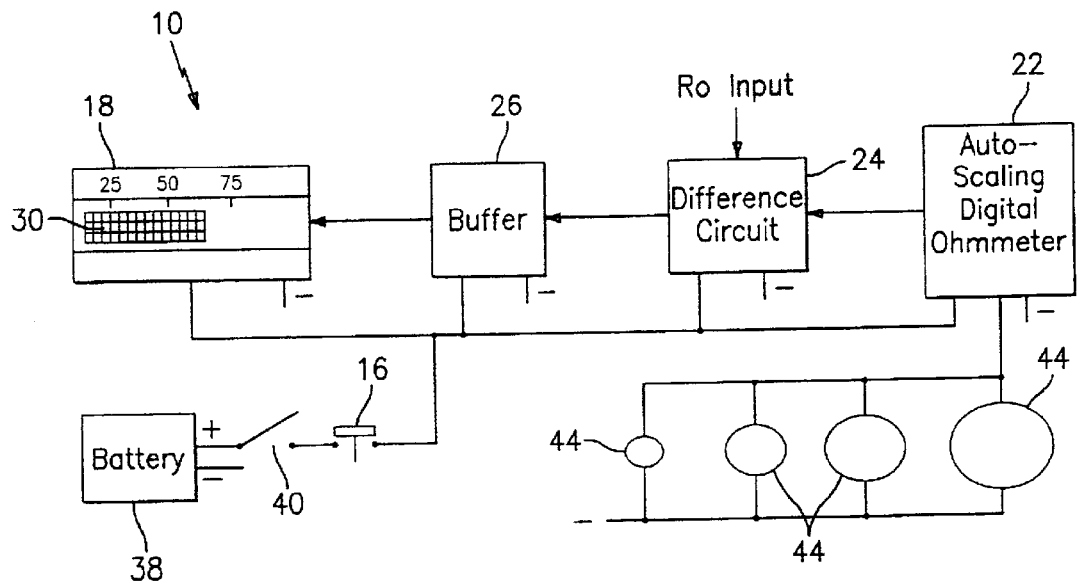
FIG. 3 is a schematic representation of the indicator system of FIG. 2.

FIGS. 2 and 3 illustrate a portable version of the system 10. The portable system 10 would operate in a similar manner, but would not be required to deal with the complexities of the integrated configuration of FIG. 1. For example, the lamp isolation relay 20 would not be necessary since the bulb being tested is isolated as a matter of course when inserted in the portable system 10.

In the portable version of the system 10, a battery unit 38 is provided and turned on via a power switch 40. The manufacturer's specified cold filament resistance $R_o$ for a bulb at or near the end of its life may be set by the calibrated knob 42. As can be seen from FIGS. 2 and 3, the portable system 10 includes a plurality of sockets 44. A bulb to be tested may be inserted in the appropriate socket 44 and the press-to-test button 16 pressed. The system 10 then measures the inserted bulb's cold filament resistance via the ohmmeter 22 and compares it to the value of $R_o$ set via the difference circuit 24. As before, the difference value is forwarded to the buffer 26 where it is stored temporarily before being forwarded to the indicator 18. The indicator 18 converts the data and displays the expected remaining life, preferably in terms of percent of its total life.

The system of the present invention can increase the operating safety of vehicles as well as improve the security and safety of commercial and municipal buildings and grounds by reducing unexpected light failures in critical areas of the facilities. The system 10 can be made to suit the needs of an individual house, car, etc., or the needs of large commercial and municipal complexes.

While it is preferred to display the remaining life of the bulb being tested as a bar, other ways of displaying the remaining life may be used. For example, the remaining life may be displayed as a digital readout or using other forms of analog displays.

If desired, other criteria can be used to measure the expected time to failure of a bulb such as: its present load current can be measured (on a continuous basis if desired) and compared to that specified by the manufacturer and taking the drop in operating current to be the indicator of expected life remaining. Alternatively, one can monitor a bulb's time of operation and compare it to the expected life advertised.

It is apparent that there has been provided in accordance with the present invention an estimated remaining lamp life indicator system which fully satisfies the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

What is claimed is:

1. A system indicating an estimated remaining life for a light bulb comprising:
   means for determining a physical condition of said light bulb while said light bulb is in a non-operating mode;
   means for comparing the physical condition of said light bulb to a reference physical condition of a light bulb near an end of its life;
   means for displaying an indication of a life expectancy for said light bulb;
   wherein said physical condition determining means comprises an ohmmeter for measuring cold filament resistance of said light bulb; and
   wherein said comparing means comprises a difference circuit having said measured cold filament resistance as one input and a reference near end of life filament resistance as a second input.

2. A system according to claim 1 wherein said difference circuit compares said measured cold filament resistance to said reference near end of life filament resistance and outputs a difference signal which represents a difference between said measured cold filament resistance and said reference near end of life filament resistance.

3. A system according to claim 2, wherein said difference signal is outputted in a digital format.

4. A system indicating an estimated remaining life for a light bulb comprising:
   means for determining a physical condition of said light bulb while said light bulb is in a non-operating mode;
   means for comparing the physical condition of said light bulb to a reference physical condition of a light bulb near an end of its life;
   means for displaying in an indication of a life expectancy for said light bulb;
   wherein said physical condition determining means comprises an ohmmeter for measuring cold filament resistance of said light bulb;
   wherein said comparing means comprises a difference circuit having said measured cold filament resistance as one input and a reference near end of life filament resistance as a second input;
   wherein said difference circuit compares said measured cold filament resistance to said reference near end of life filament resistance and outputs a difference signal which represents a difference between said measured cold filament resistance and said reference near end of life filament resistance; and
   a buffer for temporarily storing said outputted difference signal and then passing said outputted difference signal to said life expectancy displaying means.

5. A system according to claim 4 wherein said life expectancy displaying means processes said outputted difference signal and has means for displaying the life expectancy of said light bulb.

6. A system according to claim 5 wherein said life expectancy displaying means displays the remaining life of said light bulb as a bar representing percent of life remaining.

7. A system according to claim 1 wherein said system is integrated into a vehicle.

8. A system according to claim 1 wherein said system is portable and includes at least one socket for testing said light bulb.

9. A system according to claim 1 further comprising a lamp isolation relay for isolating said light bulb from any other component which may cause the physical condition determining means to erroneously measure the physical condition of said light bulb.

10. A system according to claim 1 further comprising a battery connected to said physical condition determining means, said comparing means, and said life expectancy displaying means and a switch for disconnecting said battery.

11. A system according to claim 10 further comprising a press-to-test button electrically connected to said switch for applying power from said battery to said system when said light bulb is being tested.

12. A system according to claim 1 wherein said physical condition determining means comprises means for measuring a load current of the light bulb.

13. A circuit for determining the remaining life of at least one light bulb comprising:
   a source of electrical power;
   an ohmmeter for measuring cold filament resistance of said at least one light bulb;
   a difference circuit for comparing the measured cold filament resistance of each said light bulb to a reference near end of life filament resistance and for outputting at least one difference signal; and
   a life expectancy indicator for receiving said at least one difference signal and for displaying the remaining life for each said light bulb.

14. A test circuit according to claim 13 further comprising a press to test switch positioned intermediate said power source and said ohmmeter, said difference circuit, and said life expectancy indicator, said press-to-test switch being pressed to test said at least one light bulb.

15. A test circuit according to claim 13 further comprising a power switch for insuring that said at least one light bulb has its filament resistance measured while in a cold condition.

16. A test circuit according to claim 13 further comprising at least one socket for holding said at least one light bulb being tested and said at least one socket being connected to said ohmmeter.

17. A circuit for determining the remaining life of at least one light bulb comprising:
   a source of electrical power;
   an ohmmeter for measuring cold filament resistance of said at least one light bulb;
   a difference circuit for corn arm the measured cold filament resistance of each said light bulb to a reference near end of life filament resistance and for outputting at least one difference signal;
   a life expectancy indicator for receiving said at least one difference signal and for displaying the remaining life for each said light bulb; and
   a buffer intermediate said difference circuit and said life expectancy indicator for temporarily storing said at least one difference signal outputted by said difference circuit.

18. A method for estimating the remaining life of a light bulb comprising:
   determining a cold filament resistance for a light bulb being tested; and
   comparing said determined cold filament resistance to a reference near end of life filament resistance and outputting a difference signal representative of the remaining life expectancy of said light bulb.

19. A method for estimating the remaining life of a light bulb comprising:
   determining a cold filament resistance for a light bulb being tested;
   comparing said determined cold filament resistance to a reference near end of life filament resistance and outputting a difference signal representative of the remaining life expectancy of said light bulb; and
   displaying said difference signal as a percent of remaining light bulb life.

* * * * *